(12) United States Patent
Chao

(10) Patent No.: US 6,519,502 B2
(45) Date of Patent: Feb. 11, 2003

(54) APPARATUS AND METHOD FOR POSITIONING A CASSETTE POD ONTO A LOADPORT BY AN OVERHEAD HOIST TRANSPORT SYSTEM

(75) Inventor: Albert Chao, Kaohsiung (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 119 days.

(21) Appl. No.: 09/820,104

(22) Filed: Mar. 28, 2001

(65) Prior Publication Data
US 2002/0143427 A1 Oct. 3, 2002

(51) Int. Cl.7 .......................... G06F 19/00; B65G 49/07
(52) U.S. Cl. ........................ 700/213; 414/935; 414/940
(58) Field of Search ............................... 700/213, 214; 414/935, 940; 198/401, 465.4

(56) References Cited

U.S. PATENT DOCUMENTS 5,970,818 A * 10/1999 Kikuchi et al. ............ 414/936
6,152,669 A * 11/2000 Morita et al. .............. 414/940
6,186,331 B1 * 2/2001 Kinpara et al. ............ 206/454
6,261,044 B1 * 7/2001 Fosnight et al. ........... 414/940
6,273,261 B1 * 8/2001 Hosoi ...................... 206/459.5
6,396,072 B1 * 5/2002 Meyhofer et al. .......... 250/239
6,443,400 B2 * 9/2002 Murata et al. .............. 246/1 C
6,443,686 B1 * 9/2002 Wiesler et al. ............. 414/940

* cited by examiner

Primary Examiner—Christopher P. Ellis
Assistant Examiner—Gene O. Crawford
(74) Attorney, Agent, or Firm—Tung & Associates

(57) ABSTRACT

An apparatus and a method for positioning a cassette pod onto a loadport of a process machine by an overhead hoist transport system are disclosed. The apparatus consists of four sensor plates each equipped with a connecting rod, a compressible spring and a vibration sensor. The apparatus further includes a concave mirror mounted on a bottom surface of a cassette pod and a light source and a photosensor mounted at a center location on the loadport. The apparatus further includes a process controller for receiving a signal from the photosensor indicating an incorrect position of the cassette pod and then sending a second signal to the OHT system such that the position of the OHT can be corrected and calibrated accordingly to position the cassette pod on the loadport in an accurate manner.

20 Claims, 3 Drawing Sheets

APPARATUS AND METHOD FOR POSITIONING A CASSETTE POD ONTO A LOADPORT BY AN OVERHEAD HOIST TRANSPORT SYSTEM

FIELD OF THE INVENTION

The present invention generally relates to an apparatus and a method for positioning a cassette pod onto a loadport by an overhead hoist transport system and more particularly, relates to an apparatus and a method for positioning a cassette pod wherein the apparatus allows the auto-positioning of the pod by using four sensor plates and an electro-optical assembly.

BACKGROUND OF THE INVENTION

In the manufacturing of a product, the product is usually processed at many work stations or processing machines. The transporting or conveying of partially finished products, or work-in-process (WIP) parts, is an important aspect in the total manufacturing process. The conveying of semiconductor wafers is especially important in the manufacturing of integrated circuit chips due to the delicate nature of the chips. Furthermore, in fabricating an IC product, a multiplicity of fabrication steps, i.e. as many as several hundred, is usually required to complete the fabrication process. A semiconductor wafer or IC chips must be transported between various process stations in order to perform various fabrication processes.

For instance, to complete the fabrication of an IC chip, various steps of deposition, cleaning, ion implantation, etching and passivation steps must be carried out before an IC chip is packaged for shipment. Each of these fabrication steps must be performed in a different process machine, i.e. a chemical vapor deposition chamber, an ion implantation chamber, an etcher, etc. A partially processed semiconductor wafer must be conveyed between various work stations many times before the fabrication process is completed. The safe conveying and accurate tracking of such semiconductor wafers or work-in-process parts in a semiconductor fabrication facility is therefore an important aspect of the total fabrication process.

Conventionally, partially finished semiconductor wafers or WIP parts are conveyed in a fabrication plant by automatically guided vehicles or overhead transport vehicles that travel on predetermined routes or tracks. For the conveying of semiconductor wafers, the wafers are normally loaded into cassettes pods, such as SMIF (standard machine interface) or FOUP (front opening unified pod), and then picked up and placed in the automatic conveying vehicles. For identifying and locating the various semiconductor wafers or WIP parts being transported, the cassettes or pods are normally labeled with a tag positioned on the side of the cassette or pod. The tags can be read automatically by a tag reader that is mounted on the guard rails of the conveying vehicle.

In an automatic material handling system (AMHS), stockers are widely used in conjunction with automatically guided or overhead transport vehicles, either on the ground or suspended on tracks, for the storing and transporting of semiconductor wafers in SMIF pods or in wafer cassettes. For instance, three possible configurations for utilizing a stocker may be provided. In case A, a stocker is utilized for storing WIP wafers in SMIF pods and transporting them first to tool A, then to tool B, and finally to tool C for three separate processing steps to be conducted on the wafers. After the processing in tool C is completed, the SMIF pod is returned to the stocker for possible conveying to another stocker. The configuration in case A is theoretically workable but hardly ever possible in a fabrication environment since the tools or processing equipment cannot always be arranged nearby to accommodate the processing of wafers in the stocker.

In the second configuration, a stocker and a plurality of buffer stations A, B and C are used to accommodate different processes to be conducted in tool A, tool B and tool C. A SMIF pod may be first delivered to buffer station A from the stocker and waits there for processing in tool A. Buffer stations B and C are similarly utilized in connection with tools B and C. The buffer stations A, B and C therefore become holding stations for conducting processes on the wafers. This configuration provides a workable solution to the fabrication process, however, requires excessive floor space because of the additional buffer stations required. The configuration is therefore not feasible for use in a semiconductor fabrication facility.

In the third configuration, a stocker is provided for controlling the storage and conveying of WIP wafers to tools A, B and C. After a SMIF pod is delivered to one of the three tools, the SMIF pod is always returned to the stocker before it is sent to the next processing tool. This is a viable process since only one stocker is required for handling three different processing tools and that no buffer station is needed. This configuration illustrates that the frequency of use of the stocker is extremely high since the stocker itself is used as a buffer station for all three tools. The accessing of the stocker is therefore more frequent than that required in the previous two configurations.

FIG. 1 illustrates a schematic of a typical automatic material handling system 20 that utilizes a central corridor 22, a plurality of bays 24 and a multiplicity of process machines 26. A multiplicity of stockers 30 are utilized for providing input/out to bay 24, or to precessing machines 26 located on the bay 24. The central corridor 22 designed for bay lay-out is frequently used in an efficient automatic material handling system to perform lot transportation between bays. In this configuration, the stockers 30 of the automatic material handling system become the pathway for both input and output of the bay. Unfortunately, the stocker 30 frequently becomes a bottleneck for internal transportation. It has been observed that a major cause for the stockers 30 to be the bottleneck is the input/output ports of the stockers.

In modern semiconductor fabrication facilities, especially for the 200 mm or 300 mm FAB plants, automatic guided vehicles (AGV) and overhead hoist transport (OHT) are extensively used to automate the wafer transport process as much as possible. The AGE and OHT utilize the input/output ports of a stocker to load or unload wafer lots, i.e. normally stored in POUFs. FIG. 2 is a perspective view of an overhead hoist transport system 32 consisting of two vehicles 34,36 that travel on a track 38. An input port 40 and an output port 42 are provided on the stocker 30. As shown in FIG. 2, the overhead transport vehicle 36 stops at a position for unloading a FOUP 44 into the input port 40. The second overhead transport vehicle 34 waits on track 38 for input from stocker 30 until the first overhead transport vehicle 36 moves out of the way.

Similarly, the OHT system is used to deliver a cassette pod such as a FOUP to a process machine. This is shown in FIG. 3. A cassette pod 10 of the FOUP type is positioned on a loadport 12 of a process machine 14. The loadport 12 is equipped with a plurality of locating pins 16 for the proper positioning of the cassette pod 10. A detailed perspective view of the FOUP 10 is shown in FIG. 4. The FOUP 10 is constructed by a body portion 18 and a cover portion 28. The body portion 18 is provided with a cavity 46 equipped with a multiplicity of partitions 48 for the positioning of 25 wafers of the 300 mm size. The body portion 18 is further provided with sloped handles 50 on both sides of the body for ease of transporting. On top of the body portion 18, is provided with a plate member 52 for gripping by a transport arm (not shown) of the OHT system (not shown).

When an OHT system is utilized to transport a cassette pod to a process machine, problems arise when the loadport of the process machine is not in alignment with the OHT system. Mis-positioned cassette pod on a loadport not only affects the operation of loading/unloading from the pod, but also in severe instances may cause the cassette pod to tip over and breakage of the wafers. Conventionally, a laser surveying instrument is used to align the cassette pod, i.e. or the loadport of the process machine, to an OHT system. The laser equipment may be properly used in a pilot plant setup, however, is not practical in a fabrication facility for several reasons. First, the laser equipment is high cost and difficult to operate. Secondly, laser emissions are harmful to human eyes and thus when used, may disturb other operators that are working in the same intra-bay. In a production facility, there are frequently 20 or 30 process machines lined up in an intra-bay area. It is therefore extremely difficult to use laser for aligning one machine, while not disturbing the operation of the other machines.

In the fabrication facility for 300 mm wafers, the OHT system is the most widely used cassette transport system. It is therefore important to be able to align all the cassette pods or the loadports of the process machines in a straight line in the same OHT intra-bay to assure the integrity of the fabrication process.

It is therefore an object of the present invention to provide an apparatus for positioning a cassette pod by an overhead hoist transport system that does not have the drawbacks or shortcomings of the conventional apparatus.

It is another object of the present invention to provide an apparatus for positioning a cassette pod by an overhead hoist transport system that is capable of auto-positioning the pod onto a loadport with accuracy.

It is a further object of the present invention to provide an apparatus for positioning a cassette pod by an overhead hoist transport system wherein four sensor plates, a concave mirror and an electro-optical assembly are utilized.

It is another further object of the present invention to provide an apparatus for positioning a cassette pod by an overhead hoist transport system in an automated manner.

It is still another object of the present invention to provide an apparatus for positioning a cassette pod by an overhead hoist transport system utilizing a closed-loop control system.

It is yet another object of the present invention to provide a method for positioning a cassette pod by an overhead hoist transport system utilizing four sensor plates for sensing the position of a pod as it is lowered onto a loadport from the OHT system.

It is still another further object of the present invention to provide a method for positioning a cassette pod by an overhead hoist transport system by first sensing the position of a pod by four sensor plates and then correcting the OHT system by an electro-optical sensing assembly.

SUMMARY OF THE INVENTION

In accordance with the present invention, an apparatus and a method for positioning a cassette pod by an overhead hoist transport system are provided.

In a preferred embodiment, an apparatus for positioning a cassette pod by an overhead hoist transport system is provided which includes four sensor plates positioned on a top surface of a loadport on a process machine to form a planar area surrounded by the plates, the planar area is smaller than a bottom surface area of the cassette pod, each of the sensor plates being positioned at an angle inclining outwardly with a back surface of the plate supported by a connecting rod and a compressible spring such that each of the sensor plates being capable of moving outwardly away from the planar area when pushed by a cassette pod, each of the connecting rods or the sensor plates being equipped with a vibration sensor for sensing any movement of a sensor plate; a concave mirror mounted on a bottom surface of the cassette pod which has a reflective surface facing downwardly; a light source and a photosensor positioned at a center of the planar area on the loadport for projecting a light beam upwardly toward the concave mirror when activated by one of the vibration sensors mounted on one of the four sensor plates or the connecting rods to be reflected and received by the phorosensor; and a process controller for receiving a signal from the photosensor to indicate a position of the cassette pod and to send a signal to the overhead hoist transport system so that the position of the OHT system is calibrated accordingly.

In the apparatus for positioning a cassette pod by an overhead hoist transport system, each of the sensor plates may be positioned at an angle between about 30° and about 75° as measured from a top surface of the loadport where the compressible spring is supported, or preferably at an angle between about 30° and about 60°. A lower edge of each of the four sensor plates may be provided with a roller means for engaging a recessed track in the top surface of the loadport. The compressible spring may be positioned parallel to the top surface of the loadport for engaging a lower end of the connecting rod, the compressible spring may be positioned parallel to the top surface of the loadport for restoring the position of a sensor plate after the plate is pushed outwardly by a cassette pod. The connecting rod pivotably engages and supports a back surface of the sensor plate. The light source and the photosensor may be provided in an electro-optical assembly. The sensor plate may be fabricated of a lightweight, rigid material such as aluminum or plastic. The sensor plate may be fabricated in a dimension of about 10 cm×10 cm.

The present invention is further directed to a method for positioning a cassette pod by an overhead hoist transport system which can be carried out by the operating steps of first positioning four sensor plates on a top surface of a loadport of a process machine to form a planar area surrounded by the plates, the planar area is smaller than a bottom surface area of the cassette pod, each of the sensor plates may be positioned at an angle inclining outwardly with a back surface of the plate supported by a connecting rod and a compressible spring such that each of the sensor plates being capable of moving outwardly away from the planar area when pushed by a cassette pod, each of the connecting rods or the sensor plates being equipped with a vibration sensor for sensing any movement of a sensor plate; mounting a concave mirror on a bottom surface of the cassette pod with a reflective surface facing downwardly; mounting a light source and a photosensor at a center of the planar area on the loadport; projecting a light beam upwardly to the concave mirror when the light source is activated by one of the vibration sensors such that the beam is reflected and received by the photosensor; sending a first signal to a process controller from the photosensor to indicate a position of the cassette pod and to calculate a deviation; and sending a second signal from the process controller to the overhead hoist transport system to calibrate the movement of the OHT system based on the deviation.

The method for positioning a cassette pod by an overhead hoist transport system may further include the step of positioning each of the sensor plates at an angle between about 30° and about 75°, or preferably between about 30° and about 60° as measured from a top surface of the loadport where the compressible spring is supported. The method may further include the step of mounting a roller means on a lower edge of each of the four sensor plates; and engaging the roller means in a recessed track in the top surface of the loadport. The method may further include the step of positioning the compressible spring parallel to the top surface of the loadport and engaging a lower end of the connecting rod. The method may further include the step of restoring the position of a sensor plate after the plate is pushed outwardly by a cassette pod, or the step of pivotably engaging and supporting a back surface of the sensor plate by the connecting rod, or the step of providing an electro-optical assembly that contains a light source and a photosensor. The method may further include the step of fabricating the sensor plate in a lightweight, rigid material such as aluminum or plastic. The method may further include the step of fabricating the sensor plate in a dimension of about 10 cm×10 cm.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
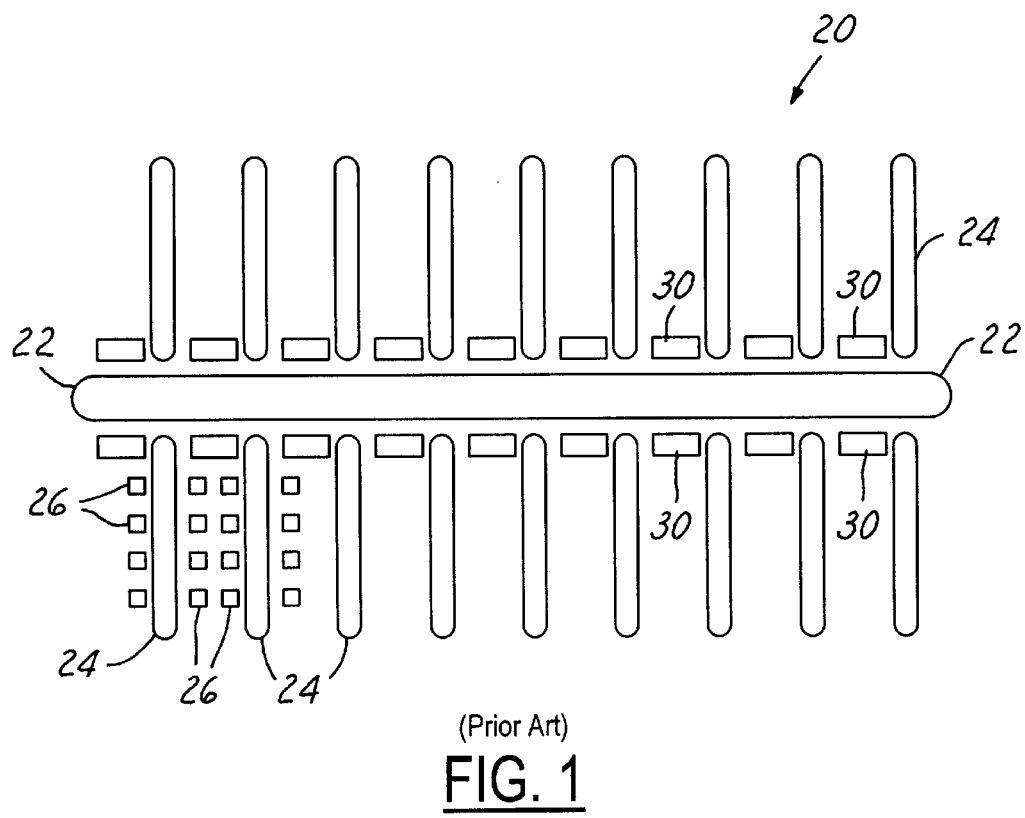
FIG. 1 is a schematic illustrating a conventional automatic material handling system utilizing a central corridor for intra-bay transport.
Figure 2:
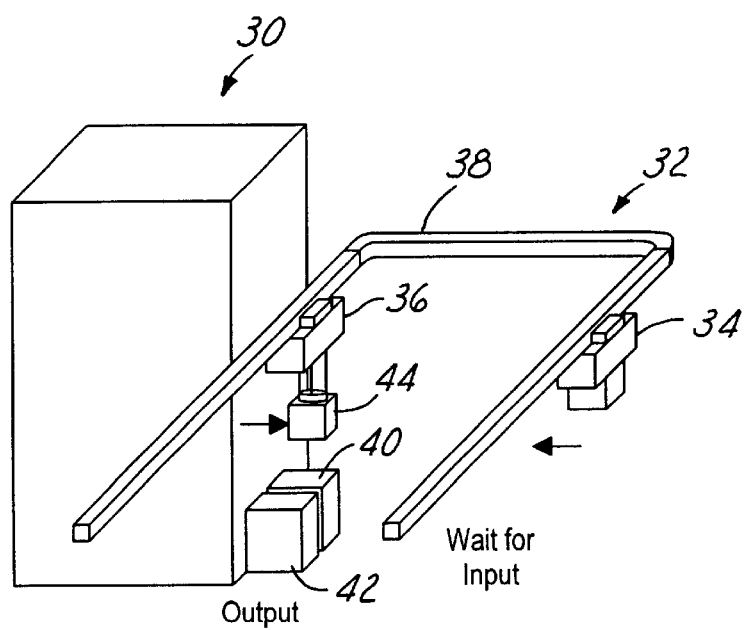
FIG. 2 is a schematic illustrating a conventional overhead hoist transport system for accessing a stocker.
Figure 3:
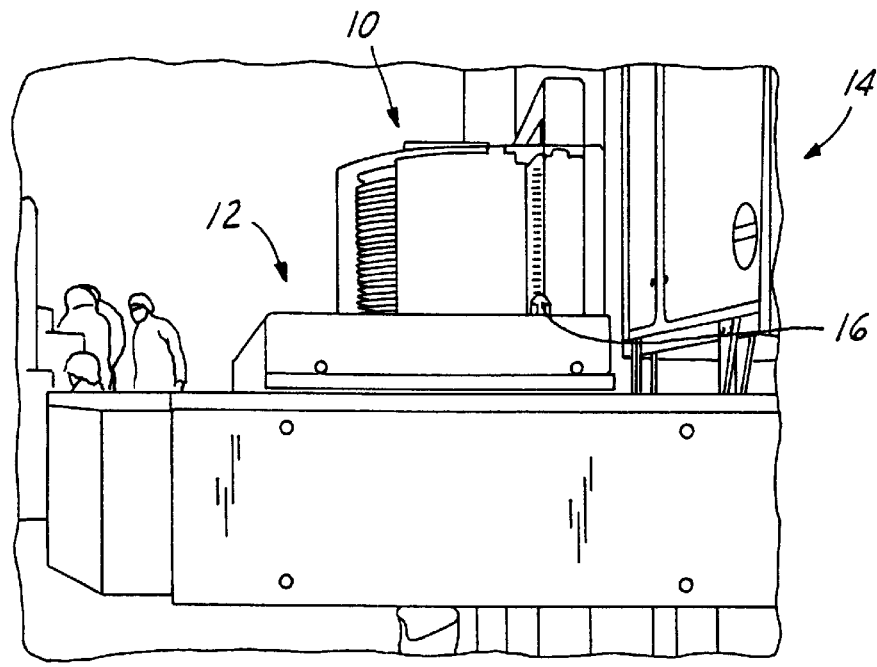
FIG. 3 is a graph illustrating a cassette pod positioned on a loadport of a process machine.
Figure 4:
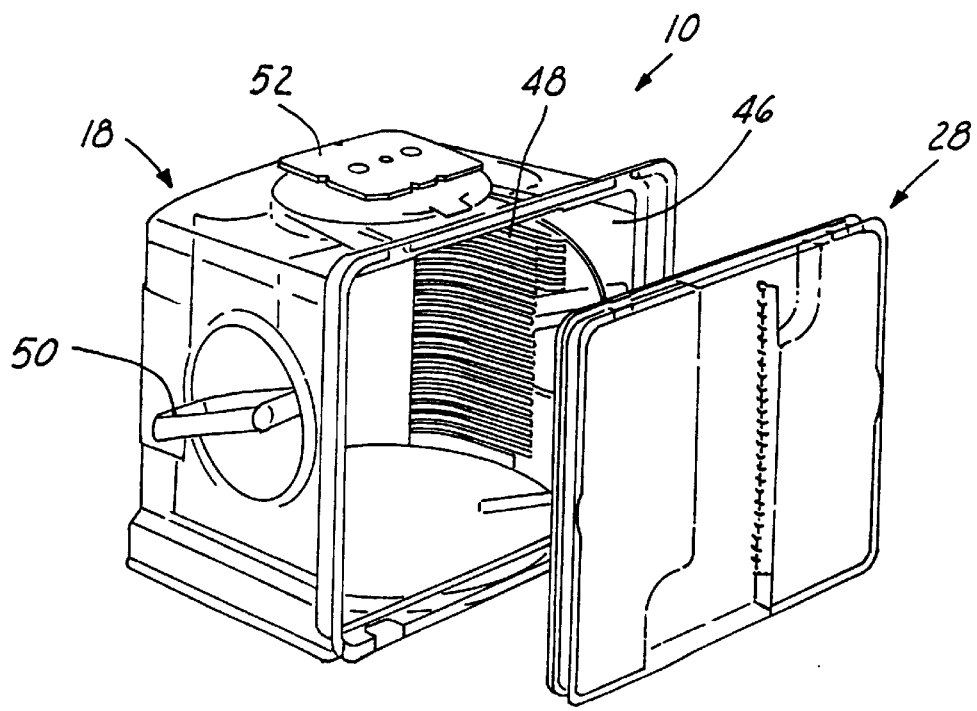
FIG. 4 is a perspective view of a front opening unified pod (FOUP).

The present invention discloses an apparatus and a method for positioning a cassette pod onto a loadport of a process machine by an overhead hoist transport system.

In the apparatus, four sensor plates each equipped with a connecting rod, a compressible spring and a vibration sensor are provided and positioned on a top surface of the loadport to form a cavity therein. A concave mirror is further provided on the bottom surface of a cassette pod such that a reflective surface is facing downwardly as the pod is being loaded onto the loadport. The apparatus further includes an electro-optical assembly of a light source and a photosensor positioned at a center of the planar area in the cavity formed by the four sensor plates and a process controller for receiving a signal from the photosensor indicating a position of the cassette pod and for sending a signal to the OHT system such that the position of the OHT can be calibrated accordingly.

Each of the sensor plates may be positioned at an angle between about 30° and about 75°, and preferably between about 30° and about 60° as measured from a top surface of the loadport where the compressible spring is supported. It is further advantageous to provide a roller means at the bottom edge of each of the sensor plates such that the plates can move smoothly in a recessed track provided in the top surface of the loadport. The compressible spring is utilized to restore the position of a sensor plate after the plate is pushed outwardly by a cassette pod. The connecting rod should be pivotably engaging the back surface of the sensor plate such that it can adapt to the different angles of the plate as it is pushed outwardly by the cassette pod.

The present invention can be utilized in any type of cassette pod delivery system, but is particularly suited for the overhead hoist transport system where a pod is lowered onto a loadport by a robotic arm in the form of cables. In the OHT system, a precise location of the position of the process tool is necessary. When the process tool has been moved for any reason, the OHT system would not accurately deliver a cassette pod onto a loadport by the conventional method.

The present invention novel apparatus utilizes four sensor plates each with a compressible spring and a connecting rod installed on a loadport which is capable of self-correcting the positioning of an OHT system to load a lopsided cassette pod to the correct position. An electro-optical assembly complete with a light source and a photosensor is also used to detect automatically the deviation from the correct position of the lopsided cassette pod for sending data to the OHT system such that the position can be corrected or modified. The apparatus can modify a loadport center offset caused by any type of accident without affecting the yield or throughput of the fabrication process.

The present invention novel method for self-positioning a cassette pod on a loadport of a process tool by an OHT system can be carried out by the following steps. First, four sets of guide assemblies, or sensor plates, are first installed on a top surface of a loadport. Each set of the guide assemblies consists of a metal plate, i.e. the sensor plate, a connecting rod and a compressible spring. A top opening area formed by the guide assembly should be larger than the cross-sectional area of the cassette pod, while a bottom opening area formed by the guide assembly should be smaller than the cross-sectional area of the cassette pod. When the center of the loadport is not aligned with the center of the cassette pod during the loading process of the pod from the OHT system, the location of the loadport which deviates from the expected position during the loading process can be detected by the guide assembly by the movement of a sensor plate. When any one of the four sensor plates is touched or pushed by the bottom of the cassette pod, the electro-optical assembly is activated such that a light beam source emits a light toward the bottom reflective mirror of the cassette pod. The light beam is reflected by the concave mirror to the photosensor, also mounted on the loadport. The deviation of the location is then calculated by a process controller by comparing to a standard position stored in the controller. The controller thus sends out a signal to the OHT system based on the deviation to correct the position of the OHT system such that the cassette pod can be accurately loaded onto the loadport.

Figure 5:
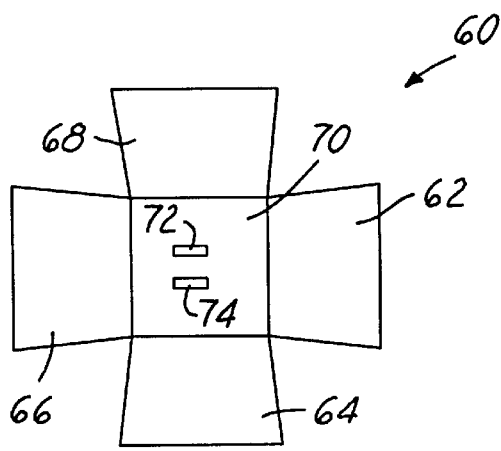
FIG. 5 is a plane view of the present invention apparatus illustrating the four sensor plates and the electro-optical sensing assembly.

Referring now to FIG. 5, wherein a present invention apparatus 60 is shown. The apparatus 60 consists of four sensor plates 62,64,66 and 68 grouped together forming a center cavity, or a planar area 70 on a loadport 80. In the planar area 70, an electro-optical system which consists of a light beam source 72 and a photosensor 74 is provided. A cross-sectional view taken along the sensor plates 62,64 is shown in FIG. 6.

Figure 6:
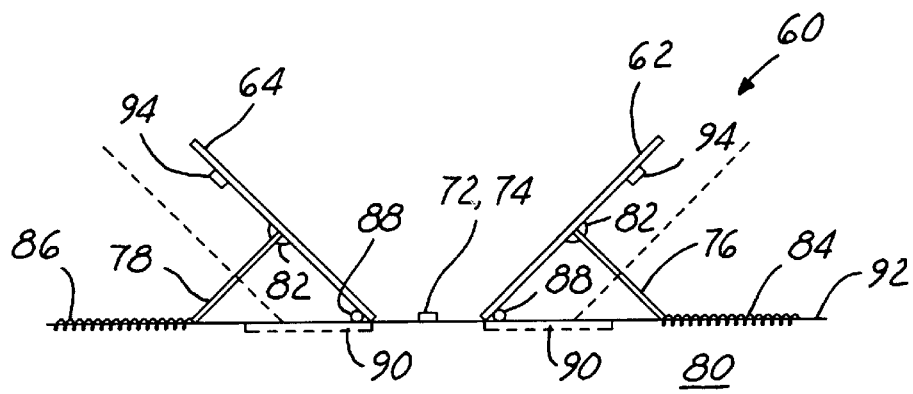
FIG. 6 is a cross-sectional view of the present invention apparatus illustrating the sensor plate, the connecting rod and the compressible spring.

As shown in FIG. 6, each of the sensor plates 62,64 is supported by a connecting rod 76,78 through a pivotable hinge 82. The lower end of the connecting rod 76,78 engages a compressible spring 84,86 such that, after a sensor plate is pushed away, i.e. or outwardly from the position shown in FIG. 6 into the ghost-line position, the compressible spring 84 pushes the sensor plate 62 back into its original position after the cassette pod 100 is removed. The sensor plates 62,64 are further equipped with a roller means 88 mounted on a lower edge of the plates such that the roller means 88 rolls smoothly in a recessed track 90 provided in the top surface 92 of the loadport 80. The roller means 88 may not always be necessary depending on the specific arrangement of the sensor plates 62,64.

Figure 7:
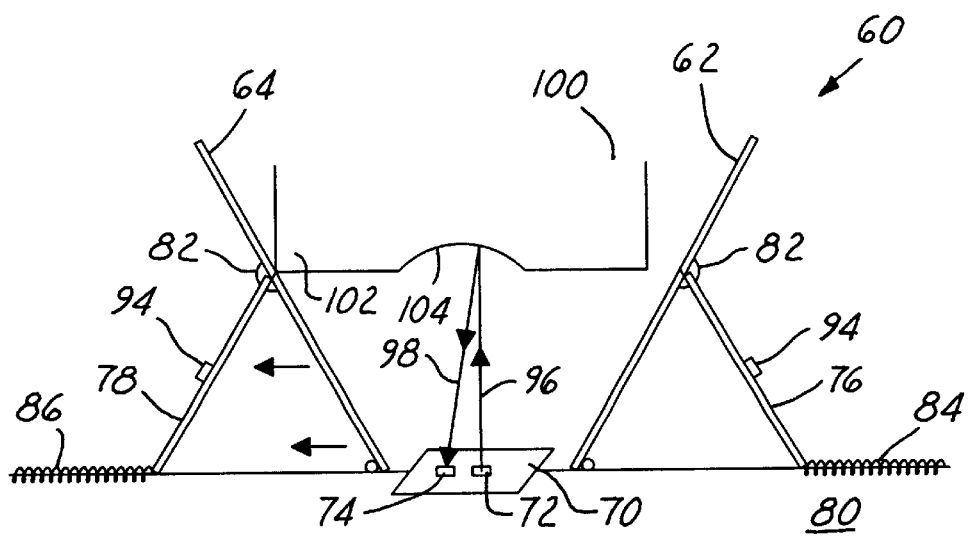
FIG. 7 is a cross-sectional view of the present invention apparatus of FIG. 6 with a cassette pod positioned therein and an electro-optical system in operation.

The sensor plates 62,64, or the connecting rods 76,78, may further be equipped with a vibration sensor 94 as shown in FIGS. 6 and 7. It should be noted that the vibration sensors 94 are mounted on the back surface of the sensor plates 62,64 in FIG. 6, while the vibration sensors 94 are mounted alternatively on the connecting rods 76,78 in FIG. 7.

FIG. 7 illustrates the operation of the present invention novel apparatus 60 by engaging the sensor plate 64 with a bottom end of a cassette pod 100. As shown in FIG. 7, when the bottom end 102 touches, or pushes on the sensor plates 64 and thereby contracting the compressible spring 86 which in turn activates a process controller (not shown), an electro-optical system that consists of a light beam source 72 and a photosensor 74 is activated to project a light beam 96 onto a concave mirror 104 provided on the bottom end 102 of the cassette pod 100. The light beam 96 is reflected by the concave mirror 104 and thus a reflected light beam 98 is detected and received by the photosensor 74. By sending a first signal to the process controller from the photosensor 74, the deviation of the position of the cassette pod 100 can be calculated by comparing to a standard position stored in the process controller. The process controller then sends out a second signal to the OHT system (not shown) to correct the OHT position and thus to more accurately place the cassette pod 100 onto the loadport 80.

The present invention novel method therefore provides a closed-loop control system by first sensing the true position of a cassette pod, calculating the deviation from a correct position and then sending a correctional signal to the OHT system to correct the position of the cassette pod. By utilizing a computer operated process controller, the process can be done rapidly and thus the position of the cassette pod can be immediately corrected in an accurate manner.

The present invention novel apparatus and a method for using the apparatus have therefore been amply described in the above description and in the appended drawings of FIGS. 5–7.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. An apparatus for positioning a cassette pod by an overhead hoist transport (OHT) system comprising:

four sensor plates positioned on a top surface of a loadport on a process machine forming a planar area surrounded by said plates, said planar area being smaller than a bottom surface area of said cassette pod, each of said sensor plates being positioned at an angle inclining outwardly with a back surface of the plate supported by a connecting rod and a compressible spring such that each of said sensor plates being capable of moving outwardly away from said planar area when pushed by a cassette pod, each of said connecting rods or said sensor plates being equipped with a vibration sensor for sensing any movement of a sensor plate;

a concave mirror mounted on a bottom surface of said cassette pod having a reflective surface facing downwardly;

a light source and a photosensor positioned at a center of said planar area on said loadport for projecting a light beam upwardly toward said concave mirror when activated by one of said vibration sensors mounted on one of said four sensor plates or said connecting rods to be reflected and received by said photo sensor; and a process controller for receiving a signal from said photosensor indicating a position of said cassette pod and for sending a signal to said overhead hoist transport system so that the position of said OHT system is calibrated accordingly.

2. An apparatus for positioning a cassette pod by an overhead hoist transport system according to claim 1, wherein each of said sensor plates being positioned at an angle between about 30° and about 75° as measured from a top surface of said loadport where said compressible spring is supported.

3. An apparatus for positioning a cassette pod by an overhead hoist transport system according to claim 1, wherein each of said sensor plates being positioned at an angle between about 30° and about 60° as measured from a top surface of said loadport where said compressible spring is supported.

4. An apparatus for positioning a cassette pod by an overhead hoist transport system according to claim 1, wherein a lower edge of each of said four sensor plates being provided with a roller means for engaging a recessed track in said top surface of said loadport.

5. An apparatus for positioning a cassette pod by an overhead hoist transport system according to claim 1, wherein said compressible spring being positioned parallel to said top surface of the loadport for engaging a lower end of said connecting rod.

6. An apparatus for positioning a cassette pod by an overhead hoist transport system according to claim 1, wherein said compressible spring being positioned parallel to said top surface of the loadport for restoring the position of a sensor plate after the plate is pushed outwardly by a cassette pod.

7. An apparatus for positioning a cassette pod by an overhead hoist transport system according to claim 1, wherein said connecting rod pivotally engages and supports a back surface of the sensor plate.

8. An apparatus for positioning a cassette pod by an overhead hoist transport system according to claim 1, wherein said light source and said photosensor being provided in an electro-optical assembly.

9. An apparatus for positioning a cassette pod by an overhead hoist transport system according to claim 1, wherein said sensor plate being fabricated of a lightweight, rigid material such as aluminum or plastic.

10. An apparatus for positioning a cassette pod by an overhead hoist transport system according to claim 1, wherein said sensor plate being fabricated in a dimension of about 10 cm×10 cm.

11. A method for positioning a cassette pod by an overhead hoist transport (OHT) system comprising the steps of:

positioning four sensor plates on a top surface of a loadport on a process machine forming a planar area surrounded by said plates, said planar area being smaller than a bottom surface area of said cassette pod, each of said sensor plates being positioned at an angle inclining outwardly with a back surface of the plate supported by a connecting rod and a compressible spring such that each of said sensor plates being capable of moving outwardly away from said planar area when pushed by a cassette pod, each of said connecting rods or said sensor plates being equipped with a vibration sensor for sensing any movement of a sensor plate;

mounting a concave mirror on a bottom surface of said cassette pod having a reflective surface facing downwardly;

mounting a light source and a photosensor at a center of said planar area on said loadport;

projecting a light beam upwardly to said concave mirror when said light source is activated by one of said vibration sensors such that the beam is reflected and received by said photo sensor;

sending a first signal to a process controller from said photosensor indicating a position of said cassette pod and calculating a deviation; and sending a second signal from said process controller to said overhead hoist transport system to calibrate the movement of said OHT system based on said deviation.

12. A method for positioning a cassette pod by an overhead hoist transport system according to claim 11 further comprising the step of positioning each of said sensor plates at an angle between about 30° and about 75° as measured from a top surface of said loadport where said compressible spring is supported.

13. A method for positioning a cassette pod by an overhead hoist transport system according to claim 11 further comprising the step of positioning each of said sensor plates at an angle between about 30° and about 60° as measured from a top surface of said loadport where said compressible spring is supported.

14. A method for positioning a cassette pod by an overhead hoist transport system according to claim 11 further comprising the step of:

mounting a roller means on a lower edge of each of said four sensor plates; and engaging said roller means in a recessed track in said top surface of said loadport.

15. A method for positioning a cassette pod by an overhead hoist transport system according to claim 11 further comprising the step of positioning said compressible spring parallel to said top surface of the loadport and engaging a lower end of said connecting rod.

16. A method for positioning a cassette pod by an overhead hoist transport system according to claim 15 further comprising the step of restoring the position of a sensor plate after the plate is pushed outwardly by a cassette pod.

17. A method for positioning a cassette pod by an overhead hoist transport system according to claim 11 further comprising the step of pivotally engaging and supporting a back surface of the sensor plate by said connecting rod.

18. A method for positioning a cassette pod by an overhead hoist transport system according to claim 11 further comprising the step of providing an electro-optical assembly that contains a light source and a photosensor.

19. A method for positioning a cassette pod by an overhead hoist transport system according to claim 11 further comprising the step of fabricating said sensor plate of a lightweight, rigid material such as aluminum or plastic.

20. A method for positioning a cassette pod by an overhead hoist transport system according to claim 11 further comprising the step of fabricating said sensor plate in a dimension of about 10 cm×10 cm.

* * * * *